United States Patent
Kurashina et al.

(10) Patent No.: US 8,618,483 B2
(45) Date of Patent: Dec. 31, 2013

(54) BOLOMETER TYPE TERAHERTZ WAVE DETECTOR

(75) Inventors: Seiji Kurashina, Tokyo (JP); Naoki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 249 days.

(21) Appl. No.: 13/151,837

(22) Filed: Jun. 2, 2011

(65) Prior Publication Data

US 2011/0303847 A1     Dec. 15, 2011

(30) Foreign Application Priority Data

Jun. 15, 2010   (JP) .................................. 2010-136499

(51) Int. Cl.
*G01J 5/00* (2006.01)
*G01J 5/20* (2006.01)
*H01L 27/14* (2006.01)

(52) U.S. Cl.
USPC .................................... 250/338.3; 250/338.4

(58) Field of Classification Search
USPC .......................................... 250/338.4, 338.3
See application file for complete search history.

(56) References Cited

U.S. PATENT DOCUMENTS

| 6,552,344 B1 | 4/2003 | Sone et al. | |
|---|---|---|---|
| 2005/0116169 A1* | 6/2005 | Tohyama et al. | 250/338.1 |
| 2008/0237467 A1* | 10/2008 | Oda et al. | 250/338.3 |

FOREIGN PATENT DOCUMENTS

| JP | 2001215151 A | * | 8/2001 |
|---|---|---|---|
| JP | 2008241438 A | | 10/2008 |

OTHER PUBLICATIONS

N. Oda et al., "Detection of terahertz radiation from quantum cascade laser, using vanadium oxide microbolometer focal plane arrays" Proceedings of SPIE, vol. 6940, 2003, pp. 69402Y-1~12.
European Search Report for EP 11 16 8670 completed Sep. 13, 2011.

* cited by examiner

*Primary Examiner* — David Porta
*Assistant Examiner* — Abra Fein

(57) ABSTRACT

A bolometer type Terahertz wave detector comprises: a temperature detecting portion having a thin bolometer film formed on a substrate, a reflective film that reflects Terahertz waves formed on the substrate at a position facing the temperature detecting portion, and an absorption film formed on the top surface of part of an eave-like member that extends to the inside from the perimeter edge section of the temperature detecting portion and that absorbs Terahertz waves. The reflective film and the absorption film form an optical resonant structure. A thermal isolation structure is formed by a support portion that supports the temperature detecting portion such that it is separated from the substrate by a gap. The eave-like member is supported by the support portion so that it is separated from the substrate by a gap.

6 Claims, 9 Drawing Sheets

BOLOMETER TYPE TERAHERTZ WAVE DETECTOR

INCORPORATION BY REFERENCE

This application is based on Japanese Patent Application No. 2010-136499 filed on Jun. 15, 2010, including the specification, claims, drawings and summary. The disclosure of the above Japanese Patent Application is incorporated herein by reference in its entirety.

TECHNICAL FIELD

The present invention relates to a detector that detects electromagnetic waves in the Terahertz frequency band (THz waves), and more particularly to a bolometer type Terahertz wave detector.

BACKGROUND ART

In recent years, electromagnetic waves in the Terahertz frequency band that are between light and radio waves (in other words, electromagnetic waves having a frequency of $10^{12}$ Hz, and a wavelength of 30 µm to 1 mm, hereafter referred to as THz waves), are gaining attention as electromagnetic waves that directly reflect information about an object. In order to detect THz (Terahertz) waves, technology of a bolometer type infrared detector having thermal isolation structure is used. As related technology, there is a 2-dimensional bolometer type THz wave detector that is disclosed in Japanese Patent Application KOKAI Publication No. 2008-241438 and SPIE literature (Oda, et al.; Proceedings of SPIE, Vol. 6940 (2008), pp. 69402Y-1 to 69402Y-12).

FIG. 6 illustrates the pixel structure of the bolometer type THz wave detector of the technology mentioned above. The bolometer type THz wave detector 1 comprises a circuit substrate 2 in which a read-out integrated circuit 2a and the like are formed, a reflective film 3 that is formed on that circuit substrate 2 and that reflects incident THz waves, a contact 4 that is electrically connected to the read-out integrated circuit 2a, and a first protective film 5 that is formed on the reflective film 3 and the read-out integrated circuit 2a. Moreover, a support portion 13 that comprises a second protective film 6, a third protective film 8, an electrode wiring 9 and a fourth protective film 10 is formed on the contact 4. The electrode wiring 9 that is included in the support portion 13 is electrically connected to the read-out integrated circuit 2a via the contact 4. This support portion 13, together with forming a space underneath a diaphragm-shaped temperature detecting portion 14, which comprises the second protective film 6, a thin bolometer film 7, the third protective film 8, the fourth protective film 10 and an absorption film 11, forms an air gap 15 between the temperature detecting portion 14 and the first protective film 5 (circuit substrate 2). The electrode wiring 9 is electrically connected to both end sections of the thin bolometer film 7. An eave-like member 12 for absorbing incident THz waves is formed around the temperature detecting portion 14. Absorption film 11 is also formed on this eave-like member 12.

Features of the pixel structure in this related technology are that the gap (air gap) between the reflective film 3 and the temperature detecting portion 14 and the gap between the reflective film 3 and the eave-like member 12 are both set based on an infrared wavelength, and the sheet resistance of the temperature detecting portion 14 is set to 10 Ω/square to 100Ω/square. As a result, with the basic structure of a bolometer type infrared detector array sensor being maintained, an improvement of THz wave sensitivity, for example a nearly 6-fold increase in the sensitivity at 3 THz (100 µm wavelength), is achieved by simply adding an adsorption film 11 (Oda, et al.; Proceedings of SPIE, Vol. 6940 (2008), pp. 69402Y-1 to 69402Y-12).

In the pixel structure of the 2-dimensional bolometer type THz wave detector of the related technology above, when the gap between the reflective film 3 and the absorption film 11 on the temperature detecting portion 14, and the gap between the reflective film 3 and the absorption film 11 on the eave-like member 12 are set to 1.5 µm (β1% occupancy) and 3.0 µm (β2% occupancy), respectively based on an infrared wavelength, the absorptance of that pixel structure of Terahertz waves is dramatically improved as described above when compared with the case when there is no absorption film 11, however, the absorptance still remains a small value. This phenomenon is explained below using a model calculation.

Typically, the sensitivity of a 2-dimensional bolometer type THz wave detector is proportional to the overall absorptance of electromagnetic waves (THz waves) by a temperature detecting portion and an eave-like member. The pixel structure in FIG. 6 is divided into a temperature detection section (diaphragm) 14 (area I) and an eave-like member 12 (area II) as is simply illustrated in FIG. 7. Here, the gap between the temperature detecting portion (diaphragm) 14 (area I) and the reflective film 3, and the gap (air gap) between the eave-like member 12 (area II) and the reflective film 3 are taken to be $d_1$ and $d_2$, respectively, and the occupancy (%) of each area I and II is taken to be β1 and β2, respectively. By taking the sheet resistance of the absorption film 11 that is formed on the temperature detecting portion 14 and the eave-like member 12 to be σS, and the sheet resistance of the reflective film 3 to be σr, and using the equation given in P. A. Silberg (Journal of Optical Society of America, vol. 47 (1957), pp. 575-578), the overall absorptance (η) of the electromagnetic waves (THz waves) by the 2-dimensional bolometer type THz wave detector is given by Equation 1 below.

Overall absorption: $\eta = \beta_1 A(\lambda, d_1) + \beta_2 A(\lambda, d_2)$ (Equation 1)

where $$A(\lambda, d_1) = \frac{4}{Dn^2}\{[f_s(f_r+1)^2/n^2 + f_r]\sin^2\theta + (f_r + f_s)\cos^2\theta\}$$

$D = [(f_r+1)(f_s+1)/n^2+1]^2 \sin^2\theta + [(f_r+f_s+2)^2/n^2]\cos^2\theta$ $f_r = 120\pi/\sigma_r$
$f_s = 120\pi/\sigma_s$
$\theta = 2\pi n d_1/\lambda$ FIG. 8 illustrates the relationship between the overall absorptance of THz waves and the sheet resistance of the absorption film at THz wavelengths λ=70, 100, 150 and 300 µm. In the cases illustrated in FIG. 8, the occupancy rates of area I and area II are 50% and 30%, respectively. As can be understood from FIG. 8, in the case of the related technology, the maximum values of the overall absorptance at the THz wavelengths of 70 µm, 100 µm, 150 µm and 300 µm are low values of 22%, 17%, 12% and 6%, respectively.

The absorptance of silicon nitride is disclosed in lecture materials by Q. Hu et al. ("Real-time THz Imaging Using Quantum-cascade Lasers and Focal-plane Array Cameras", 2nd International Workshop on Quantum Cascade Lasers, Sep. 6-9 (2006)). The absorptance for silicon nitride is illustrated in FIG. 9. As can be understood from FIG. 9, silicon nitride is nearly transparent at a THz wavelength of 50 µm or greater. Therefore, in this wavelength area, by using the equation in the SPIE literature (Oda, et al.; Proceedings of SPIE, Vol. 6940 (2008), pgs. 69402Y-1 to 69402Y-12) (an absorptance by an interference effect) it is possible to calculate the absorptance of the thermal isolation structure of a bolometer type THz wave detector. However, at a wavelength of 50 μm or less, the absorptance of silicon nitride itself become large, so it is necessary to keep in mind that the absorptance by the silicon nitride itself, which is the main structural material of the temperature detecting portion, contributes to the absorptance rather than the contribution to the absorptance by an interference effect.

SUMMARY

Taking the situation above into consideration, an exemplary object of the present invention is to provide a highly sensitive bolometer type THz wave detector.

In order to accomplish the exemplary object above, the bolometer type THz wave detector of the present invention comprising:

a temperature detecting portion having a thin bolometer film that is formed on a substrate;

a support portion that supports the temperature detecting portion in a state separated from the substrate by a gap;

a reflective film that reflects incident Terahertz waves and that is formed on the substrate such that the reflective film faces the temperature detecting portion;

an eave-like member that extends to the inside and the outside from the perimeter edge section of the temperature detecting portion; and an absorption film that absorbs incident Terahertz waves and that is formed on the eave-like member and the absorption film together with the reflective film forms an optical resonant structure.

With the bolometer type THz wave detector of the present invention, an improvement in sensitivity is achieved compared with that of a conventional bolometer type THz wave detector.

BRIEF DESCRIPTION OF THE DRAWINGS

These objects and other objects and advantages of the present invention will become more apparent upon reading of the following detailed description and the accompanying drawings in which.

EXEMPLARY EMBODIMENTS

As described above, a bolometer type THz wave detector that improves the sensitivity is proposed that together with providing an eave-like member that extends to the outside from the perimeter edge section of the temperature detecting portion in the basic structure of a bolometer type infrared detector, has an absorption film that is formed on the temperature detecting portion and the eave-like member.

However, in this pixel structure, the gap between the reflective film on the circuit substrate and the temperature detecting portion (hereinafter, referred to as air gap $d_1$) and the gap between the reflective film on the circuit substrate and the eave-like member [except for the area where the temperature detecting portion is located] (hereinafter, referred to as air gap $d_2$) are different, so uniform an optical resonant structure cannot be formed over the entire pixel, and thus it is not possible to sufficiently improve sensitivity. Therefore, the pixel structure that is able to further improve the sensitivity is proposed as in the bolometer type THz wave detector of the exemplary embodiment described below.

In other words, in the bolometer type THz wave detector of the exemplary embodiment below, a temperature detecting portion that includes an electrically-connected thin bolometer film is supported by a support portion that includes electric wiring that is connected to a read-out integrated circuit that is formed in a circuit substrate such that there is a gap between the temperature detecting portion and the circuit substrate. As a result, a thermal isolation structure is formed. A reflective film that reflects THz waves is formed at a position on the circuit substrate that faces the temperature detecting portion. Together with an eave-like member that extends to the inside and the outside from the perimeter edge section of the temperature detecting portion, an absorption film that absorbs THz waves is formed on the top surface of the eave-like member that extends to the inside and the outside from the perimeter edge section of the temperature detecting portion. Furthermore, a through hole is formed in part of the eave-like member that extends to the inside from that perimeter edge section. An optical resonant structure is formed by the absorption film that is formed on the eave-like member and the reflective film on the circuit substrate. This will be explained in further detail below with reference to the drawings.

Exemplary Embodiment 1

Figure 1:
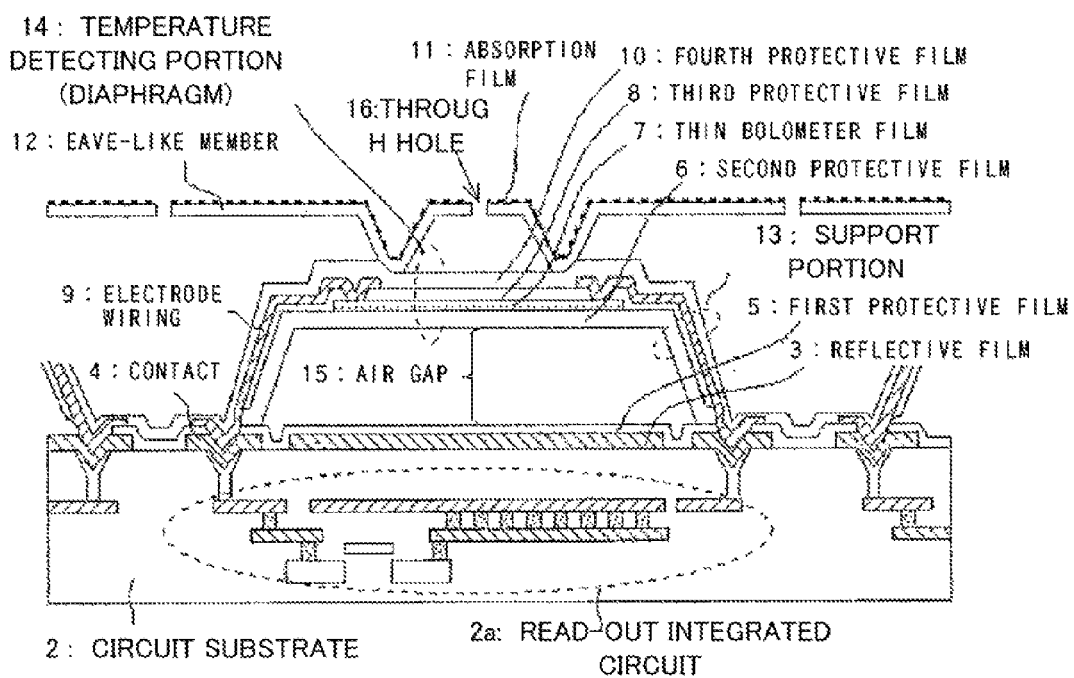
FIG. 1 is a schematic cross-sectional drawing of the pixel structure of a bolometer type THz wave detector of a first exemplary embodiment of the present invention.
Figure 2:
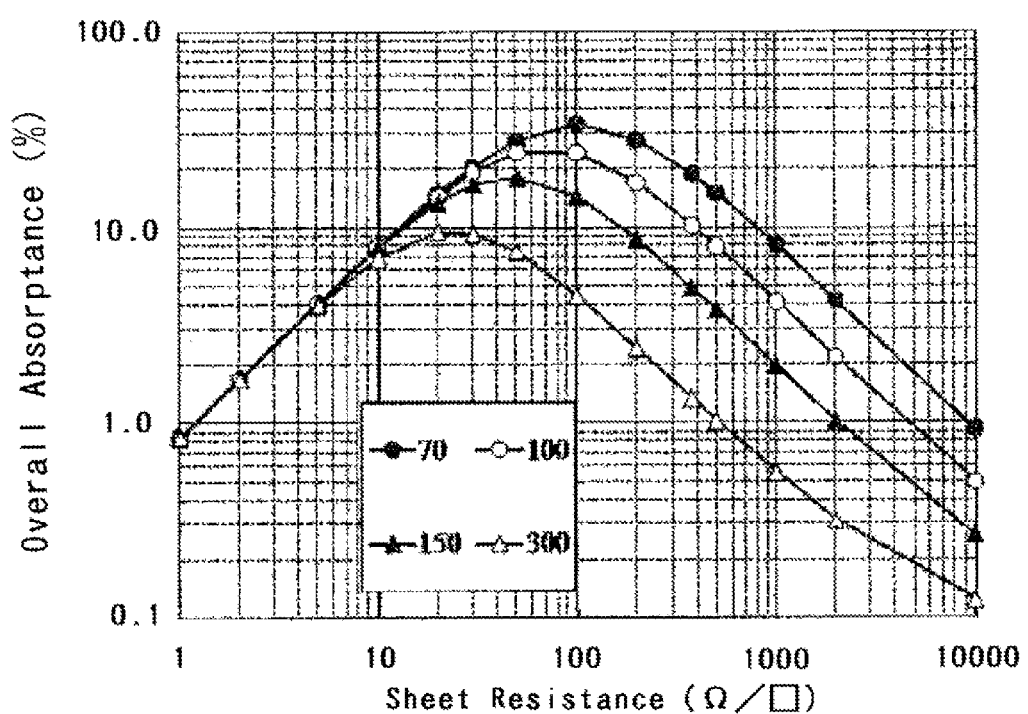
FIG. 2 is a graph illustrating the relationship between the overall absorptance and sheet resistance of the bolometer type THz wave detector of the first exemplary embodiment (in the case of where the air gap $d_1$=1.5 μm (area I: occupancy β1=0%), and the air gap $d_2$=3.0 μm (area II: occupancy β2=80%), at THz wavelengths of 70 μm, 100 μm, 150 μm and 300 μm)

In the following, the bolometer type THz wave detector of a first exemplary embodiment of the present invention is explained with reference to FIG. 1 and FIG. 2. FIG. 1 is a schematic cross-sectional drawing illustrating the pixel structure of the bolometer type THz wave detector of this embodiment, and FIG. 2 is a graph illustrating the dependence of the overall absorptance of THz waves on sheet resistance by the pixel structure in FIG. 1 at THz wavelengths of 70 μm, 100 μm, 150 μm and 300 μm.

As illustrated in FIG. 1, the bolometer type THz wave detector 1 of this embodiment comprises: a temperature detecting portion 14 that is formed on a circuit substrate 2 and includes a thin bolometer film 7; a reflective film 3 that is formed on the circuit substrate 2 and reflects THz waves that are incident on the temperature detecting portion 14 of each pixel; and the absorption film 11 that is formed on an eave-like member 12 that extends to the inside and the outside from the perimeter edge section of the temperature detecting portion 14 (the thin bolometer film 7) and absorbs incident THz waves. The reflective film 3 and the absorption film 11 form an optical resonance structure (so-called optical resonator) for effectively absorbing THz waves.

More specifically, a read-out integrated circuit 2a such as a CMOS circuit, and a contact 4 that is electrically connected to the read-out integrated circuit 2a are formed in the circuit substrate 2. Electric wiring 9 that is electrically connected to the contact 4 is arranged on the circuit substrate 2. Reflective film 3 is formed on the circuit substrate 2. A first protective film 5 is formed over the reflective film 3 and the contact 4. A second protective film 6, a third protective film 8 and a fourth protective film 10 are formed in this order from the bottom in a multi-layer shape having a U-shaped cross section (cross sectional gate shape). The thin bolometer film 7 is located between the second protective film 6 and the third protective film 8.

The temperature detecting portion 14 includes the second protective film 6, the thin bolometer film 7, the third protective film 8, the fourth protective film 10 and the absorption film 11.

The electric wiring 9 is formed between the second protective film 6 and the fourth protective film 10. The electrode wiring 9 is electrically connected to both end sections of the thin bolometer film 7, and the electric wiring 9 is electrically connected to the read-out integrated circuit 2a via the contact 4.

The second protective film 6, the third protective film 8, the electrode wiring 9 and the fourth protective film 10 form a support portion 13 having a microbridge structure. Moreover, the temperature detecting portion 14 (the thin bolometer film 7) is supported by this support portion 13 in a state such that it is separated from the reflective film 3 on the circuit substrate 2 by a gap (space) (floating state). With this structure, a thermal isolation structure is formed in the bolometer type THz wave detector 1, and the temperature detecting portion 14 has a diaphragm shape. Furthermore, an air gap 15 (corresponding to the air gap $d_1$ illustrated in FIG. 7) is formed in the space surrounded by the temperature detecting portion 14 and the support portion 13. The reflective film 3 on the circuit substrate 2 is positioned on the circuit substrate 2 such that it faces the temperature detecting portion 14 (the thin bolometer film 7) by way of the air gap 15.

Figure 7:
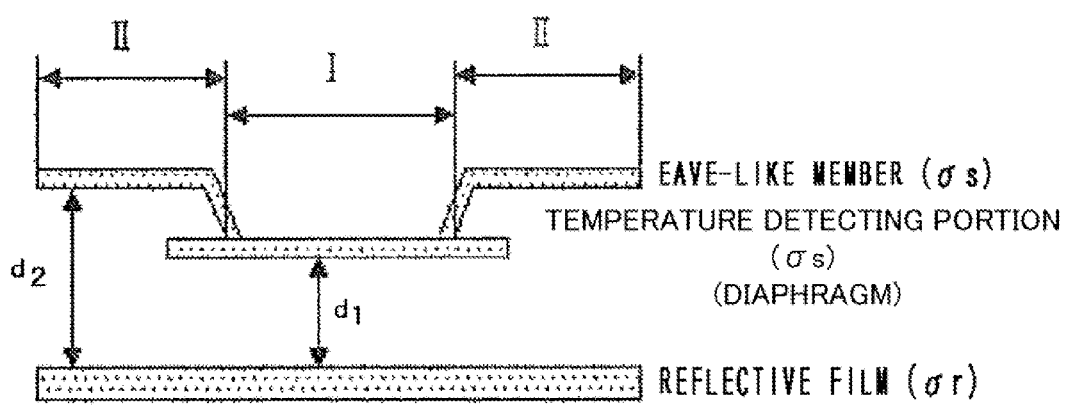
FIG. 7 is diagram of a model illustrating a simplification of FIG. 6.
Figure 8:
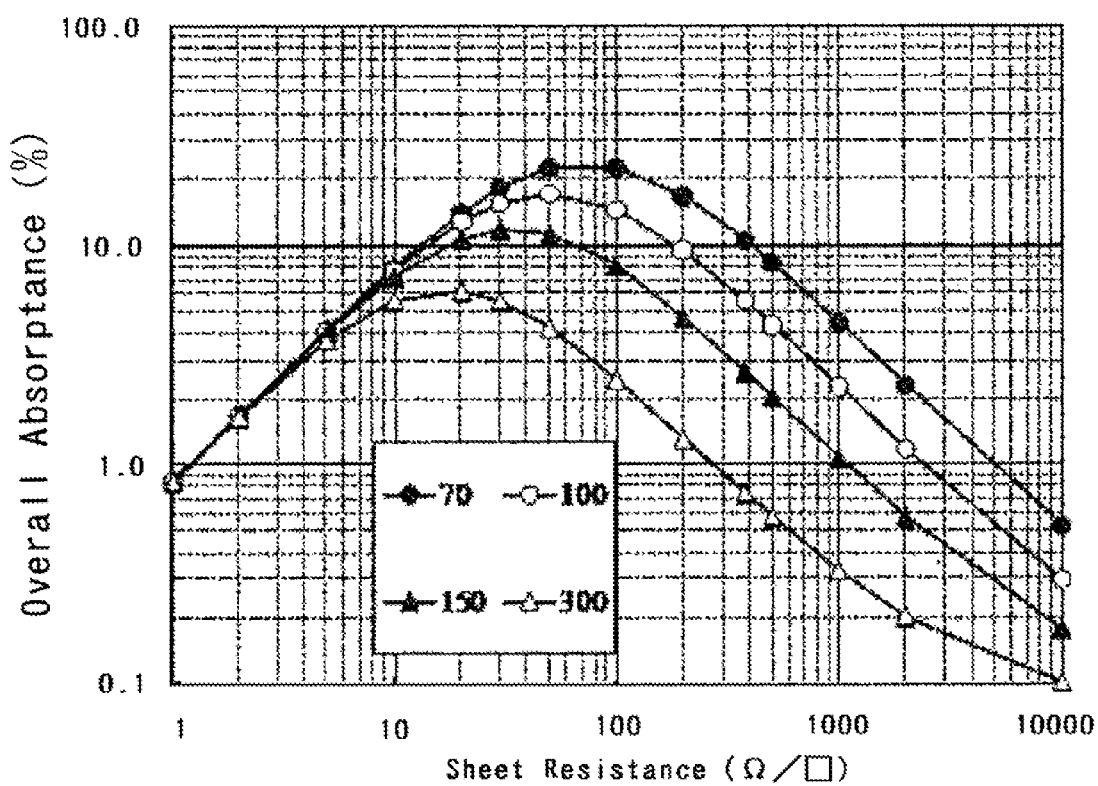
FIG. 8 is a graph illustrating the relationship between the overall absorptance and the sheet resistance of a conventional bolometer type THz wave detector (in the case where the air gap $d_1$=1.5 μm (area I: occupancy β1=50%), and the air gap $d_2$=3.0 μm (area II: occupancy β2=30%), at THz wavelengths of 70 μm, 100 μm, 150 μm and 300 μm)

An eave-like member 12 that extends to the inside and the outside from the perimeter edge section of the thin bolometer film 7 (the temperature detecting portion 14) is formed above and around the temperature detecting portion 14. This eave-like member 12 is supported by the support portion 13 so that it is separated by a space from the circuit substrate 2 and the temperature detecting portion 14. Air gaps that correspond to the air gaps $d_1$ and $d_2$ illustrated in FIG. 7 are formed on the inside and outside of the eave-like member 12. The gap between the part of the eave-like member 12 that extends to the inside from the perimeter edge section of the temperature detecting portion 14 and the circuit substrate 2, and the gap between the part of the eave-like member 12 that extends to the outside from the perimeter edge section of the temperature detecting portion 14 and the circuit substrate 2 are approximately the same.

Absorption film 11 is formed on the top surface of the eave-like member 12. In FIG. 1, the absorption film 11 is formed over both the part of the eave-like member 12 that extends to the inside from the perimeter edge section of the temperature detecting portion 14 (the thin bolometer film 7) and the part of the eave-like member 12 that extends to the outside from the perimeter edge section of the temperature detecting portion 14.

A through hole 16 that penetrates through the eave-like member 12 and the absorption film 11 is formed in the part of the eave-like member 12 that extends to the inside from the perimeter edge section of the temperature detecting portion 14 in a location above the temperature detecting portion 14 (the thin bolometer film 7). This through hole 16, as will be described later, becomes an etching hole when performing etching of a second sacrificial layer that is used as the foundation when forming the eave-like member 12, and in FIG. 1, one hole is formed above the center section of the temperature detecting portion 14 (the thin bolometer film 7). The number, position, shape and the like of the through hole 16 are not particularly limited as long as there is at least one hole formed in each pixel structure. Moreover, in FIG. 1, the absorption film 11 is formed on the top surface of the eave-like member 12, however, it is not limited to this, and the absorption film could also be formed on the rear surface (bottom surface) or inside the eave-like member 12. Furthermore, the absorption film 11 is formed on both the part of the eave-like member 12 that extends to the inside from the perimeter edge section of the temperature detecting portion 14 (the thin bolometer film 7), and the part of the eave-like member 12 that extends to the outside from the perimeter edge section of the temperature detecting portion 14, however, the absorption film 11 must be formed on at least the part of the eave-like member 12 that extends to the inside from the perimeter edge section of the temperature detecting portion 14.

In this exemplary embodiment, referencing FIG. 1, a 320× 240 pixel bolometer type uncooled array sensor having a pixel pitch of 23.5 μm is used as the bolometer type THz wave detector 1. The second protective film 6, the third protective film 8 and the fourth protective film 10 are formed using silicon nitride such that the thickness of each film is 350 nm. The thin bolometer film 7 is formed using a thin vanadium oxide film such that the film thickness is 60 nm. The electrode wiring 9 and the absorption film 11 are formed using TiAlV. Here the thickness of the TiAlV used for forming the electrode wiring 9 is set to 70 nm. The thickness of the TiAlV that is used for forming the absorption film 11 is set to 20 nm when the sheet resistance is 100 Ω/square, and the thickness of the TiAlV is set to 10 nm when the sheet resistance is 200 Ω/square.

In the pixel structure of the bolometer type THz wave detector 1 illustrated in FIG. 1, the occupancy β1 in area I where the air gap $d_1$ is 1.5 μm (see FIG. 7) is approximately 0%, and the occupancy β2 in area II where the air gap $d_2$ is 3.0 μm (see FIG. 7) is approximately 80%. In this case, the sheet resistance dependence of the overall THz wave absorptance by this pixel structure is found using Equation 1 above, and plotted in the graph illustrated in FIG. 2 for THz wavelengths of 70 μm, 100 μm, 150 μm and 300 μm. From FIG. 2 the maximum value of the overall THz wave absorptance at the THz wavelengths 70 µm, 100 µm, 150 µm and 300 µm is 34%, 24%, 18% and 9%, respectively. As a result, when compared with the values from the related art, there is an approximately 1.5-fold improvement in the overall absorptance. Typically, the sensitivity (detection sensitivity of THz waves) is proportional to the overall absorptance, so the sensitivity of the pixel structure of this exemplary embodiment is increased approximately 1.5 times when compared with the sensitivity of the pixel structure of the related art.

In the following, the method of manufacturing the bolometer type THz wave detector 1 of this exemplary embodiment will be explained with reference to FIG. 1.

Referring to FIG. 1, first, a film made of a metallic material such as Al, Ti or the like and having a thickness of approximately 500 nm is formed by a sputtering method on a circuit substrate 2 in which a read-out integrated circuit 2a such as a CMOS circuit is formed, and the metallic film is patterned using a resist as a mask. As a result, a reflective film 3 that reflects THz waves that are incident on the temperature detecting portion 14 of each pixel, and a contact 4 for electrically connecting the electrode wiring 9 and the read-out integrated circuit 2a are formed. The metallic material used is not limited to Al and Ti, and the other materials can be used as long as the material has a high reflectance of THz waves, and a small electrical resistance.

Next, a 100 nm to 500 nm thick film such as a silicon oxide film (SiO, $SiO_2$), a silicon nitride film (SiN, $Si_3N_4$), a silicon oxynitride film (SiON) or the like is formed over the entire surface of the circuit substrate 2 by the plasma CVD method, to form a first protective film 5 that protects the reflective film 3 and the contact 4.

Next, an organic film such as a photosensitive polyimide film is coated over the entire surface of the circuit substrate 2, and then exposure and development of the organic film is performed so that the area between the contact 4 and the pixel is exposed. After that, heat shrinking is performed at a temperature of about 40° C.°, and using an organic film (photosensitive polyimide film), a first sacrificial layer for forming a micro-bridge structure is formed. When doing this, taking into consideration of the thicknesses of a second protective film 6, a thin bolometer film 7, a third protective film 8 and a fourth protective film 10 that are formed in later processes, the coated amount of photosensitive polyimide film is set so that the gap between the reflective film 3 on the circuit substrate 2 and the temperature detecting portion 14 (the thin bolometer film 7) after curing is approximately ¼ of an infrared wavelength (1.5 µm in this embodiment).

Next, a 100 nm to 500 nm thick silicon nitride film is formed on the first sacrificial layer by the plasma CVD method to form the second protective film 6.

A vanadium oxide (such as $V_2O_3$, VOX) film having a film thickness of about 60 nm is deposited on the second protective layer 6 by reactive sputtering in an oxygen atmosphere, and further the vanadium oxide film is patterned using resist as a mask, and the thin bolometer film 7 is formed in the area where the temperature detecting portion 14 is set. Here, vanadium oxide is used as the thin bolometer film 7, however, as long as the temperature coefficient resistance (TCR) is large, the other materials can also be used.

Next, a silicon nitride film having a thickness of about 50 nm is formed on the thin bolometer film 7 by the plasma CVD method to form a third protective film 8 that protects the thin bolometer film 7.

The first protective film 5, the second protective film 6 and the third protective film 8 in the area directly above the contact 4, and the third protective film 8 on the end section of the thin bolometer film 7 are then removed, and a hole is formed in that area directly above the contact 4 for electrically connecting the electric wiring 9 to the contact 4.

Next, after forming a 70 nm thick TiAlV film by a sputtering method, the TiAlV film is patterned using a resist as a mask to form electrode wiring 9 that is electrically connected to the thin bolometer film 7. This electrode wiring 9, together with electrically connecting the thin bolometer film 7 and the read-out integrated circuit 2a inside the circuit substrate 2 via the contact 4, supports the thin bolometer film 7 to the circuit substrate 2 in a state such that the thin bolometer film 7 is separated from the circuit substrate 2 by a gap. The material of the electrode wiring 9 is not limited to TiAlV, and the other metallic materials such as Al, Cu, Au, Ti, W, Mo and the like can be used.

Next, a 100 nm to 500 nm thick silicon nitride film is formed by the plasma CVD method to form the fourth protective film 10 that protects the electrode wiring 9.

The second protective film 6, the third protective film 8 and the fourth protective film 10 are partially etched by plasma etching using a fluoride gas such as methane tetrafluoride gas, ethane hexafluoride, trifluoromethane, or a gas mixture of these gases and oxygen. As a result, a through hole (not illustrated in the figure) is formed in a specified area on the first sacrificial layer comprising cured photosensitive polyimide film to partially expose the first sacrificial layer.

Next, photosensitive polyimide is coated over the entire surface of the circuit substrate 2, and after performing exposure and development of that photosensitive polyimide so that the perimeter edge section of the temperature detecting portion 14 is exposed, heat treatment is performed. As a result, a second sacrificial layer is formed in the area of the center section of the temperature detecting portion 14 and the area between the temperature detecting portion 14 and the adjacent temperature detecting portion 14. The thickness of this second sacrificial layer is approximately 3 µm.

Next, by depositing a silicon nitride film on top of the second sacrificial layer until the film thickness becomes 200 nm to 600 nm, an eave-like member 12 is formed such that it extends to the inside and the outside from the perimeter edge section of the thin bolometer film 7.

Next, a TiAlV film is formed on the top surface of the eave-like member 12 by a sputtering method to form an absorption film 11. When doing this, the film thicknesses of the eave-like member 12 and the absorption film 11 are set so that the sheet resistances of those are desired values. This absorption film 11 is for effectively absorbing THz waves. The material of the absorption film 11 is not limited to TiAlV, and the other materials for which the sheet resistance which can be set to a desired value can be used. The absorption film 11 can also be formed on the top surface, the rear surface (bottom surface) and the inside of the eave-like member as long as it faces the reflective film 3 on the circuit substrate 2.

After that, a through hole (a through hole 16) is formed in the eave-like member 12 such that it passes through the eave-like member 12 and the absorption film 11 above the temperature detecting portion 14 and between adjacent pixels so that the second sacrificial layer (polyimide) is partially exposed.

Furthermore, by performing ashing using $O_2$ gas plasma, the first sacrificial layer and the second sacrificial layer are removed by way of the through hole. As a result, a bolometer type THz wave detector 1 having a microbridge structure so that the support portion 13 separates the temperature detecting portion 14 from the circuit substrate 2 (the absorption film 11) by a gap is obtained.

The material used for forming the second protective film 6, the third protective film 8 and the fourth protective film 10 is not limited to being a silicon nitride film, and a silicon oxide film or silicon oxynitride film can also be used, and the film thicknesses can also be suitably set.

Moreover, the first or second sacrificial layer can be formed using polysilicon or Al. When polysilicon is used for the first or second sacrificial layer and the first or second sacrificial layer is to be removed, wet etching that uses hydrazine or tetramethylammonium hydroxide (TMAH) or dry etching that uses $XeF_2$ plasma can be used, for example. Furthermore, when Al is used for the first or second sacrificial layer and the first or second sacrificial layer is to be removed, wet etching can be used that uses hydrochloric acid or hot phosphoric acid, for example.

When the second protective film 6, the third protective film 8 and the fourth protective film 10 are formed using a silicon oxide film, the first or second sacrificial layer can be formed using silicon nitride film. Moreover, When the second protective film 6, the third protective film 8 and the fourth protective film 10 are formed using silicon nitride film, the first or second sacrificial layer can be formed using a silicon oxide film.

When silicon nitride is used for the first or second sacrificial layer and the first or second sacrificial layer is to be removed, it is possible to use wet etching that uses hot phosphoric acid, for example. On the other hand, when a silicon oxide film is used for the first or second sacrificial layer and the first or second sacrificial layer is to be removed, it is possible to use wet etching that uses hydrofluoric acid, for example.

As was explained above, with the bolometer type THz wave detector of this exemplary embodiment, it is possible to solve the problem of a conventional bolometer type THz wave detector 1 as explained above (for example, being low for an overall absorptance of approximately 22% at a THz wavelength of 70 μm, and an overall absorptance of approximately 6% at a THz wavelength of 300 μm). In other words, with the bolometer type THz wave detector 1 of this exemplary embodiment, the overall absorptance at a THz wavelength of 70 μm can be increased from 22% to 34%, for example, and the overall absorptance at a THz wavelength of 300 μm can be increased from 6% to 9%. When converting this to sensitivity, this increase corresponds to an improvement of approximately 1.5 times. As a result, with the bolometer type THz wave detector 1 of this exemplary embodiment, an approximately 1.5-fold improvement in sensitivity is achieved when compared with the conventional technology.

Embodiment 2

Figure 3:
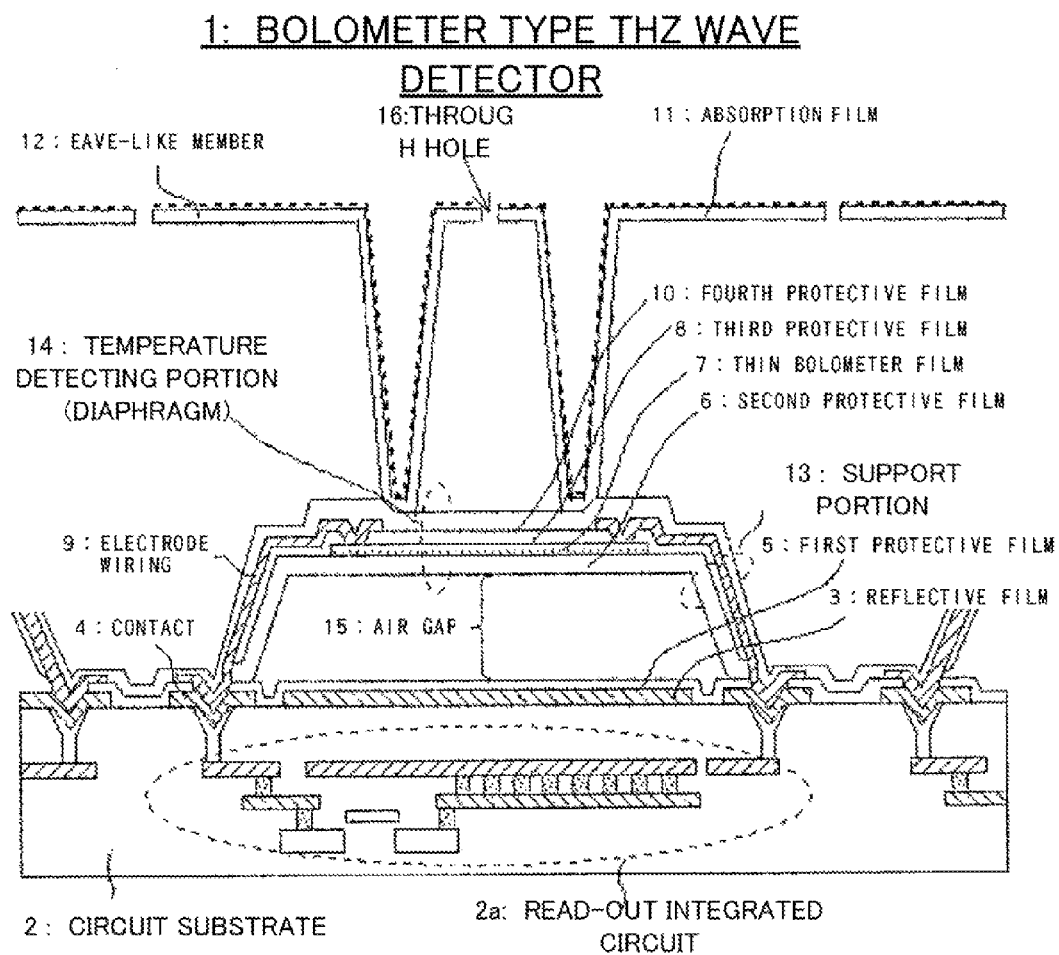
FIG. 3 is a schematic cross-sectional drawing of the pixel structure of a bolometer type THz wave detector of a second exemplary embodiment of the present invention.
Figure 4:
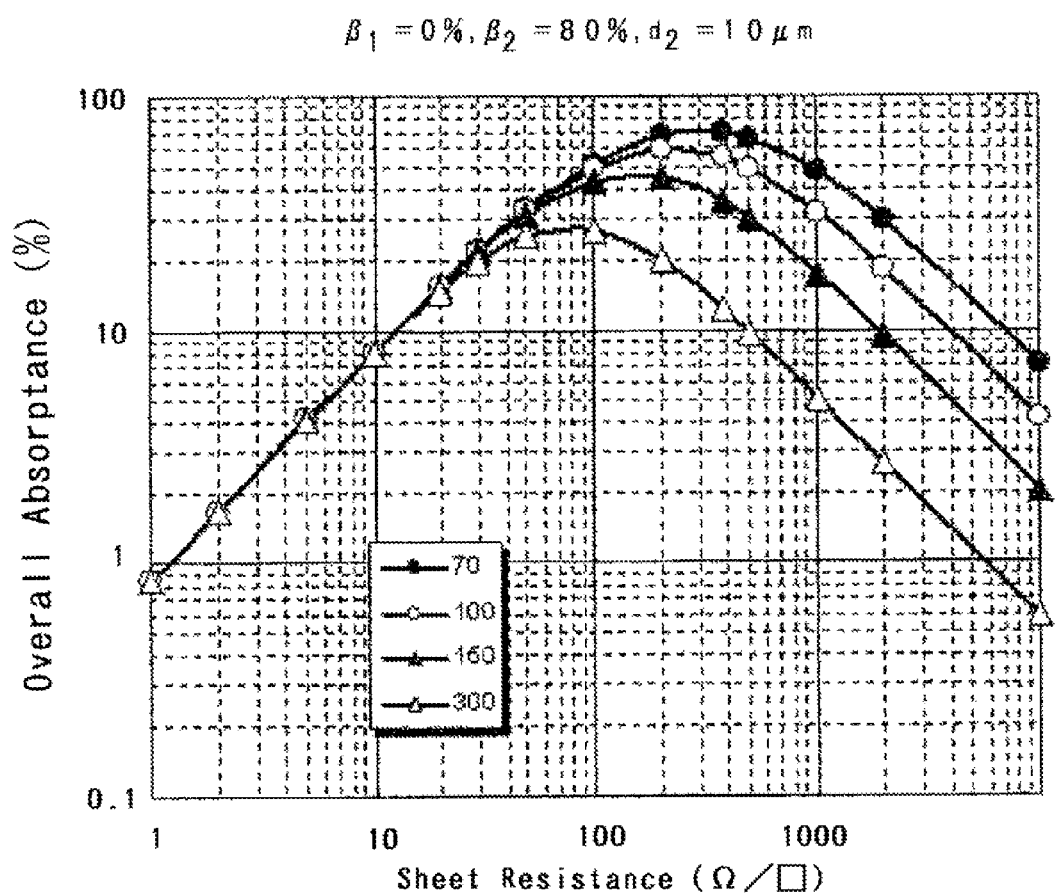
FIG. 4 is a graph illustrating the relationship between the overall absorptance and the sheet resistance of the bolometer type THz wave detector of the second exemplary embodiment (in the case where the air gap $d_1$=1.5 μm (area I: occupancy β1=0%), and the air gap $d_2$=10 μm (area II: occupancy β2=80%), at THz wavelengths of 70 μm, 100 μm, 150 μm and 300 μm)
Figure 5:
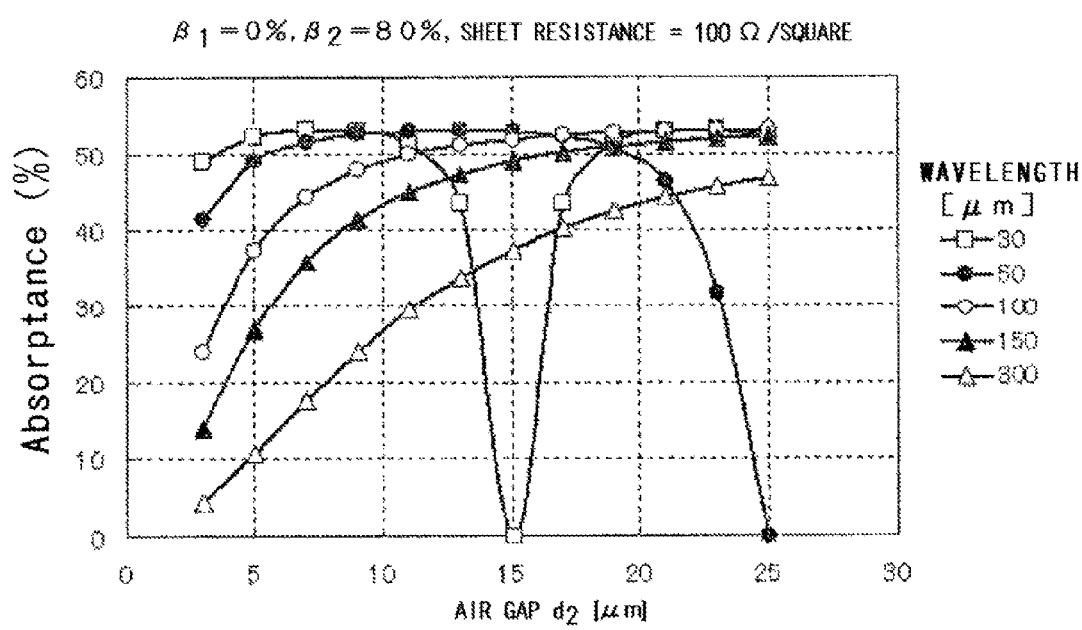
FIG. 5 is a graph illustrating the relationship between the overall absorptance and the air gap $d_2$ of the bolometer type THz wave detector of the second exemplary embodiment (in the case of sheet resistance: 100 Ω/square, the air gap $d_1$=1.5 μm (area I: occupancy β1=0%), and the air gap $d_2$=3 μm to 25 μm (area II: occupancy β2=80%), at THz wavelengths of 70 μm, 100 μm, 150 μm and 300 μm)
Figure 6:
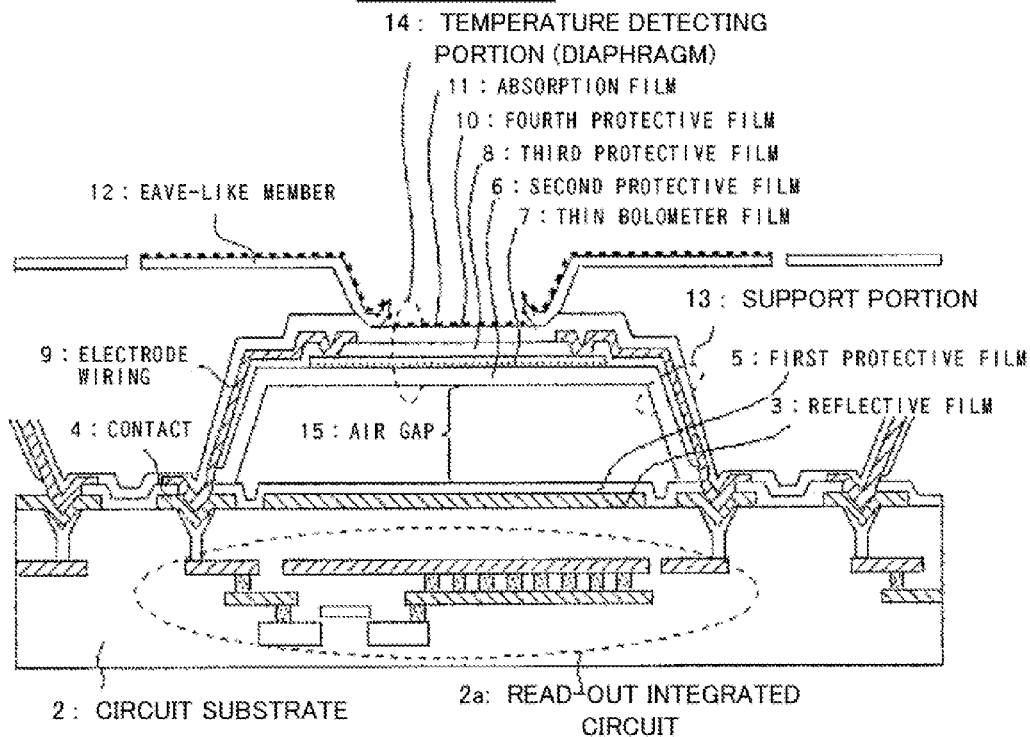
FIG. 6 is a schematic cross-sectional drawing of the pixel structure of a conventional bolometer type THz wave detector.

In the following, a bolometer type THz wave detector of a second exemplary embodiment of the present invention will be explained with reference to FIG. 3 to FIG. 5. FIG. 3 is a schematic cross-sectional view illustrating the pixel structure of the bolometer type THz wave detector of this exemplary embodiment, and FIG. 4 is a graph illustrating the dependence of the overall absorptance of THz waves on sheet resistance by the pixel structure at THz wavelengths of 70 μm, 100 μm, 150 μm and 300 μm. Moreover, FIG. 5 is a graph illustrating the dependence of the overall absorptance of THz waves on the air gap $d_2$ at each wavelength from the THz wavelength of 30 μm (frequency of 10 THz) to the THz wavelength of 300 μm (frequency of 1 THz).

As illustrated in FIG. 3, in the pixel structure of the bolometer type THz wave detector 1 of this exemplary embodiment, the air gap $d_1$ (gap between the reflective film 3 on the circuit substrate 2 and the temperature detecting portion 14) is not changed from that in the pixel structure of the first exemplary embodiment illustrated in FIG. 1, however, the air gap $d_2$ (gap between the reflective film 3 on the circuit substrate 2 and the absorption film 11 [except in the area where the thin bolometer film 7 is located]) is further widened. The other structure is the same as the pixel structure in the first exemplary embodiment, so in the following, unless specially explained, the same reference numbers will be used for corresponding locations and an explanation of those parts will be omitted.

In order to enlarge the air gap $d_1$, it is necessary for the electrode wiring 9 that electrically connects the read-out integrated circuit 2a with the temperature detecting portion 14 to go over a large uneven section that corresponds to the air gap $d_1$, so it becomes easy for the wiring to break. However, in the pixel structure illustrated in FIG. 3, that the air gap $d_1$ is set to be the same as the air gap $d_1$ of the pixel structure in the first exemplary embodiment, and there is no change in the manufacturing process up to forming the temperature detecting portion 14, so there is no breakage of the electrode wiring 9.

FIG. 4 is a graph illustrating calculated results that illustrate the dependence of the overall absorptance on sheet resistance when the occupancy β2 of area II is 80% and the air gap $d_2$ is 10 μm. From FIG. 4 it is seen that the maximum values of the overall absorptance at the THz wavelengths 70 μm, 100 μm, 150 μm and 300 μm are 65%, 62%, 55% and 34%, respectively. The overall absorptance of THz waves also depends on the wavelength, however, when the wavelength is 300 μm for example, there is an approximately 5.5-fold improvement when compared with the conventional art explained in the background.

Figure 9:
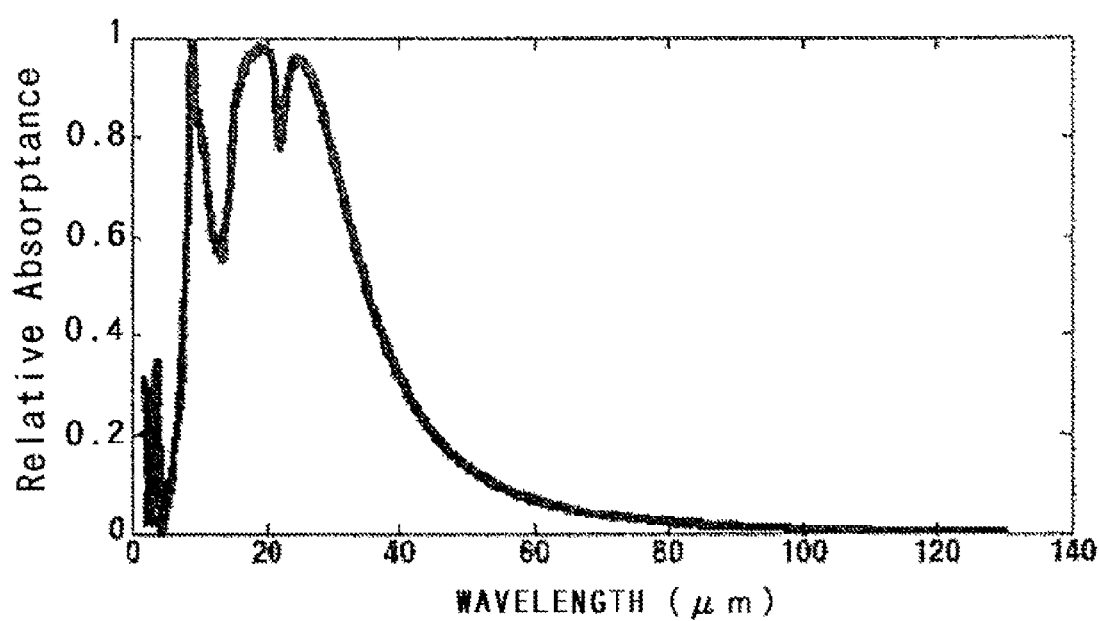
FIG. 9 is a graph illustrating the absorption characteristics of silicon nitride.

Next, the air gap $d_2$ will be considered. FIG. 5 is a graph illustrating the dependence of the overall absorptance of THz waves on the air gap $d_2$ at each wavelength from the THz wavelength of 30 μm (frequency of 10 THz) to the THz wavelength of 300 μm (frequency of 1 THz). From FIG. 5 it is seen that when the wavelength is 30 μm the absorptance greatly decreases at the air gap of 15 μm. When the wavelength is 30 μm, the absorptance of silicon nitride is large as illustrated in FIG. 9, so actually, the absorptance does not decrease extremely as illustrated in FIG. 5; however, from the results of FIG. 5, it is seen that a sufficient absorptance is maintained, so in this exemplary embodiment, the air gap $d_2$ is set to be 15 μm or less.

As was explained above, with the bolometer type THz wave detector 1 of this exemplary embodiment, when the air gap $d_2$ is 10 μm, it is possible to increase the overall absorptance at a THz wavelength of 70 μm from 22% to 65%, and to increase the overall absorptance at a THz wavelength of 300 μm from 6% to 34%. When this is converted to sensitivity, an approximately 3-fold improvement at a wavelength of 70 μm, and an approximately 5.5-fold improvement at a wavelength of 300 μm are achieved when compared with the conventional art explained in the background.

In each of the exemplary embodiments above, the case of detecting THz waves having a wavelength from 30 μm to 1 mm was described, however, the present invention is not limited to the exemplary embodiments above, and can also be applied to electromagnetic waves of the other wavelength bands.

Part or all of the exemplary embodiments above can also be described as in the supplemental notes below, however are not limited to the following descriptions.

(Supplemental Note 1)

A bolometer type Terahertz wave detector comprising:

a temperature detecting portion having a thin bolometer film that is formed on a substrate;

a support portion that supports the temperature detecting portion in a state separated from the substrate by a gap;

a reflective film that reflects incident Terahertz waves and that is formed on the substrate such that the reflective film faces the temperature detecting portion;

an eave-like member that extends to the inside and outside from the perimeter edge section of the temperature detecting portion; and an absorption film that absorbs incident Terahertz waves and that is formed on the eave-like member and the absorption film together with the reflective film forms an optical resonant structure.

(Supplemental Note 2)

The bolometer type Terahertz wave detector according to the supplemental note 1, wherein the absorption film is formed on the eave-like member in at least the part of the eave-like member that extends to the inside from the perimeter edge section of the temperature detecting portion.

(Supplemental Note 3)

The bolometer type Terahertz wave detector according to the supplemental note 1 or 2, wherein the support portion includes electric wiring that is electrically connected to the read-out integrated circuit that is formed on the substrate, and the thin bolometer film is electrically connected to the read-out integrated circuit via the electric wiring.

(Supplemental Note 4)

The bolometer type Terahertz wave detector according to any one of the supplemental notes 1 thru 3, wherein the eave-like member is supported by the support portion such that the eave-like member is separated from the substrate and the temperature detecting portion by a gap.

(Supplemental Note 5)

The bolometer type Terahertz wave detector according to any one of the supplemental notes 1 thru 4, wherein a through hole is formed in the eave-like member in the part of the eave-like member that extends to the inside from the perimeter edge section of the temperature detecting portion.

(Supplemental Note 6)

The bolometer type Terahertz wave detector according to any one of the supplemental notes 1 thru 5, wherein the gap between part of the eave-like member that extends to the inside from the perimeter edge section of the temperature detecting portion and the substrate is the same as the gap between part of the eave-like member that extends to the outside from the perimeter edge section of the temperature detecting portion.

(Supplemental Note 7)

The bolometer type Terahertz wave detector according to any one of the supplemental notes 1 thru 6, wherein the gap between the reflective film and the absorption film is set to 15 µm or less.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and the scope of the subject matter disclosed herein.

What is claimed is:

1. A bolometer type Terahertz wave detector comprising:
    a temperature detecting portion having a thin bolometer film that is formed on a substrate;
    a support portion that supports the temperature detecting portion in a state separated from the substrate by a gap;
    a reflective film that reflects incident Terahertz waves and that is formed on the substrate such that the reflective film faces the temperature detecting portion;
    an eave-like member that extends to the inside and the outside from the perimeter edge section of the temperature detecting portion; and
    an absorption film that absorbs incident Terahertz waves
    wherein:
        an optical resonant structure is configured by the reflective film,
        the absorption film on the eave-like member that extends to the outside from the perimeter edge section of the temperature detecting portion, and
        a dome-like portion formed of the absorption film on the eave-like member extends to the inside from the perimeter edge section of the temperature detecting portion, thereby enabling an effective detection of the incident Terahertz waves.

2. The bolometer type Terahertz wave detector according to claim 1, wherein the support portion includes electric wiring that is electrically connected to a read-out integrated circuit that is formed in the substrate, and the thin bolometer film is electrically connected to the read-out integrated circuit via the electric wiring.

3. The bolometer type Terahertz wave detector according to claim 1, wherein the eave-like member is supported by the support portion such that the eave-like member is separated from the substrate and the temperature detecting portion by a gap.

4. The bolometer type Terahertz wave detector according to claim 1, wherein a through hole is formed in the eave-like member in the part of the eave-like member that extends to the inside from the perimeter edge section of the temperature detecting portion.

5. The bolometer type Terahertz wave detector according to claim 1, wherein a gap between part of the eave-like member that extends to the inside from the perimeter edge section of the temperature detecting portion and the substrate is the same as a gap between part of the eave-like member that extends to the outside from the perimeter edge section of the temperature detecting portion.

6. The bolometer type Terahertz wave detector according to claim 1, wherein a gap between the reflective film and the absorption film is set to 15 µm or less.

* * * * *